(12) United States Patent
Ramachandran et al.

(10) Patent No.: US 10,838,016 B2
(45) Date of Patent: Nov. 17, 2020

(54) SHORT DETECT SCHEME FOR AN OUTPUT PIN

(71) Applicant: Texas Instruments Incorporated, Dallas, TX (US)

(72) Inventors: Bhaskar Ramachandran, Coimbatore (IN); Kushal D. Murthy, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 13 days.

(21) Appl. No.: 16/409,119

(22) Filed: May 10, 2019

(65) Prior Publication Data

US 2020/0011917 A1 Jan. 9, 2020

(30) Foreign Application Priority Data

Jul. 6, 2018 (IN) .............................. 201841025303

(51) Int. Cl.
*G01R 31/50* (2020.01)
*H03K 17/0814* (2006.01)

(52) U.S. Cl.
CPC ....... *G01R 31/50* (2020.01); *H03K 17/08142* (2013.01); *H03K 2217/0081* (2013.01)

(58) Field of Classification Search
None
See application file for complete search history.

(56) References Cited

U.S. PATENT DOCUMENTS

| | | | | |
|---|---|---|---|---|
| 3,641,546 A | * | 2/1972 | Blackburn | G01R 19/1659 340/661 |
| 4,937,697 A | * | 6/1990 | Edwards | H02H 5/044 323/276 |
| 4,969,178 A | * | 11/1990 | Chen | H04M 1/68 379/27.08 |
| 6,157,688 A | * | 12/2000 | Tamura | G06F 13/4243 375/348 |
| 6,307,659 B1 | * | 10/2001 | Gilliland | H04B 10/69 398/135 |
| 6,313,658 B1 | * | 11/2001 | Farnworth | G01R 31/52 324/750.3 |
| 6,400,545 B1 | * | 6/2002 | Baba | H02M 3/3376 361/101 |
| 6,967,488 B1 | * | 11/2005 | Arigliano | G01R 31/52 324/656 |
| 2003/0098705 A1 | * | 5/2003 | Haeuser | G01R 31/2853 324/762.03 |
| 2004/0164744 A1 | * | 8/2004 | Koga | H03M 1/1076 324/537 |
| 2006/0082376 A1 | * | 4/2006 | Allen | G01R 31/2884 324/522 |

(Continued)

*Primary Examiner* — Curtis J King
(74) *Attorney, Agent, or Firm* — Mark Allen Valetti; Charles A. Brill; Frank D. Cimino

(57) ABSTRACT

In described examples, a circuit includes a first driver. The first driver is coupled to a first node, and the first node is coupled to an output pin. A second driver is coupled to a second node, and the second node is coupled to a first voltage terminal. A comparator is coupled to the first node and the second node. A sustaining driver is coupled to the comparator and provides a threshold current to each of the first node and the second node when a short is detected at the output pin.

25 Claims, 4 Drawing Sheets

(56) References Cited

U.S. PATENT DOCUMENTS

| | | | |
|---|---|---|---|
| 2007/0064368 A1* | 3/2007 | Ohshima | H03K 17/0822 |
| | | | 361/93.1 |
| 2008/0164833 A1* | 7/2008 | Kajikawa | H02P 29/0241 |
| | | | 318/565 |
| 2009/0040142 A1* | 2/2009 | Lee | G09G 3/2932 |
| | | | 345/60 |
| 2009/0155674 A1* | 6/2009 | Ikeuchi | H01M 10/441 |
| | | | 429/91 |
| 2010/0019775 A1* | 1/2010 | Ikejiri | G01R 31/52 |
| | | | 324/537 |
| 2014/0078629 A1* | 3/2014 | Cortigiani | H02H 9/02 |
| | | | 361/79 |
| 2014/0268925 A1* | 9/2014 | Lee | H02M 3/33507 |
| | | | 363/21.18 |
| 2016/0241227 A1* | 8/2016 | Hirata | H03K 17/0822 |
| 2017/0245379 A1* | 8/2017 | Kang | G09G 3/3225 |
| 2018/0054130 A1* | 2/2018 | Moon | H02M 3/33523 |
| 2018/0226785 A1* | 8/2018 | Asanza Maldonado | |
| | | | H02H 3/08 |
| 2018/0262199 A1* | 9/2018 | Chauhan | H03M 1/747 |
| 2019/0213936 A1* | 7/2019 | Cho | H01L 27/1244 |

\* cited by examiner

SHORT DETECT SCHEME FOR AN OUTPUT PIN

CROSS REFERENCES TO RELATED APPLICATIONS

This application claims priority from India provisional patent application no. 201841025303 filed on Jul. 6, 2018 which is hereby incorporated by reference in its entirety.

TECHNICAL FIELD

This relates generally to integrated circuit and devices, and more particularly to a scheme of detecting short at an output pin of an integrated circuit.

BACKGROUND

Integrated circuit (IC) packages typically include several pins by which the circuit can be connected to other electronic devices in an electronic system. For example, an IC package may include a processor and pins that facilitate connections between that processor and other electronic devices outside of the IC package, such as memory, antennas, audio processors, graphics cards, and the like. Some such IC pins are output pins that are used to drive loads external to the IC package.

Multiple applications and some reliability and safety certifications demand that IC packages are fault tolerant and a short at the IC pin should not cause failure of the IC package or failure of the PCB on which the IC package is mounted or failure of the system on which the PCB is mounted. It is desired to have a defensive mechanism which can detect short at the IC pin and take protective action to prevent such cascading failures. For an IC pin receiving static voltage, the detection of short is simple and known. However, for an IC pin receiving a varying voltage, the detection of short is a complex and expensive process. This get further complicated in cases where after a protective action is taken to overcome short at the IC pin, the protective action prevents any further detection of short at the IC pin.

SUMMARY

In described examples, a circuit includes a first driver. The first driver is coupled to a first node, and the first node is coupled to an output pin. A second driver is coupled to a second node, and the second node is coupled to a first voltage terminal. A comparator is coupled to the first node and the second node. A sustaining driver is coupled to the comparator and provides a threshold current to each of the first node and the second node when a short is detected at the output pin.

DETAILED DESCRIPTION OF EXAMPLE EMBODIMENTS

Figure 1:
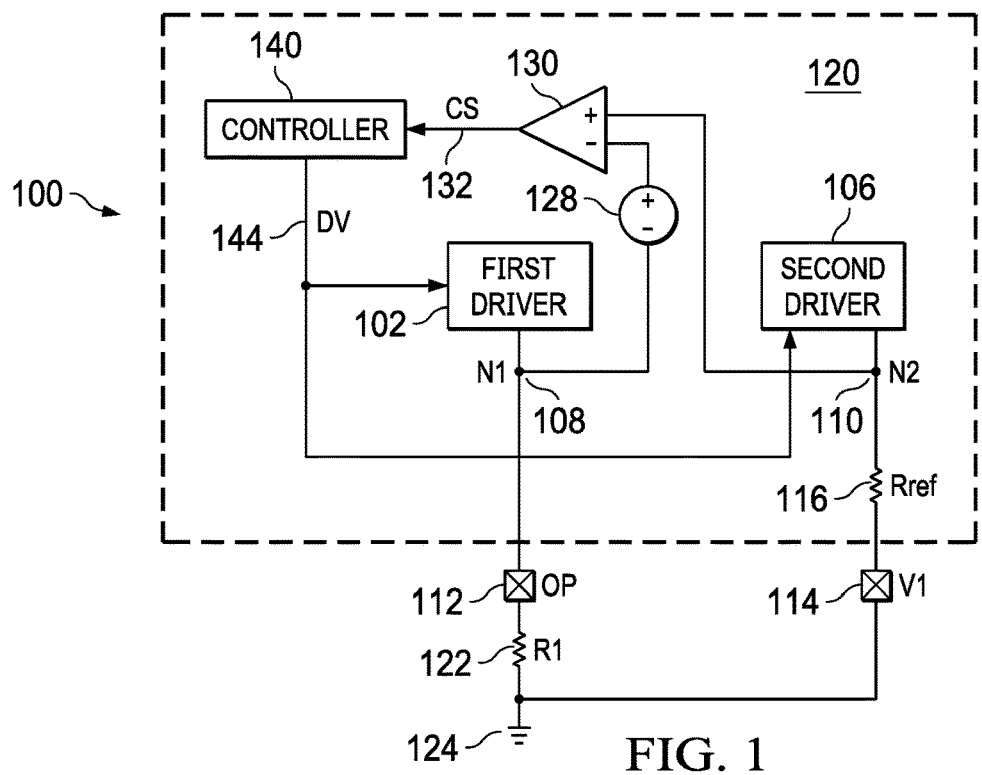
FIG. 1 is a block diagram of a circuit.

FIG. 1 is a block diagram of a circuit 100. The circuit 100 includes a first driver 102, a second driver 106, a comparator 130 and a controller 140. The first driver 102 is coupled to a first node N1 108, and the second driver 106 is coupled to a second node N2 110. The first node N1 108 is coupled to an output pin OP 112. The second node N2 110 is also coupled to a reference impedance Rref 116, and the reference impedance Rref 116 is coupled to a first voltage terminal V1 114.

In one example, the first driver 102, the second driver 106, the comparator 130, the controller 140 and the reference impedance Rref 116 are part of an integrated circuit (or device) 120. The output pin OP 112 is coupled to an external impedance R1 122. The external impedance R1 122 is not part of the integrated circuit 120, in one version. The external impedance R1 122 is coupled to a ground terminal 124. The comparator 130 is coupled to the first node N1 108 and the second node N2 110.

The controller 140 is coupled to the comparator 130. The first driver 102 and the second driver 106 are also coupled to the controller 140. In one example, the circuit 100 includes an offset power source 128 placed between the first node N1 108 and the comparator 130.

In operation, the first driver 102 drives the external impedance R1 122. This generates a voltage at the first node N1 108. The second driver 106 drives the reference impedance Rref 116. This generates a voltage at the second node N2 110. The comparator 130 compares the voltage at the first node N1 108 and the voltage at the second node N2 110 to generate a control signal CS 132. The offset power source 128 is useful to mitigate errors introduced by various circuit components such as the first driver 102, the second driver 106 and the comparator 130. An error introduced by these circuit components can impact the comparison performed by the comparator 130. Therefore, the offset power source 128 compensates for the error introduced by these circuit components by providing an equal voltage or current in opposite polarity to the comparator 130.

In one example, the second driver 106 and the reference impedance Rref 116 are configured proportionately to the first driver 102 and the external impedance R1 122, such that the voltage generated at the second node N2 110 is within a predetermined range of the voltage generated at the first node N1 108 during non-short condition of the output pin OP 112. For example, the second driver 106 and the reference impedance Rref 116 produce a voltage at the second node N2 110 that is expected under normal or non-short condition. In another example, the second driver 106 and the reference impedance Rref 116 are configured proportionately to the first driver 102 and a lowest possible external impedance R1 122 in non-short condition, such that the voltage generated at the second node N2 110 is less than the voltage generated at the first node N1 108 during non-short condition of the output pin OP 112. A drive strength of the second driver 106 can be equal, proportional or scaled-down version of a drive strength of the first driver 102 based on the design requirements of the circuit 100.

The control signal CS 132 is provided to the controller 140. The controller 140 keeps the first driver 102 and the second driver 106 enabled by providing them a driving voltage DV 144. In one version, when the output pin OP 112 is not shorted i.e. it is not coupled to the ground terminal 124, the voltage generated at the first node N1 108 is greater than the voltage generated at the second node N2 110. The control signal CS 132 generated by the comparator 130 would be at logic low. The controller 140 on receiving the logic low control signal CS 132 would keep the first driver 102 and the second driver 106 enabled by providing them the driving voltage DV 144.

In case the output pin OP 112 is shorted, the voltage generated at the first node N1 108 is less than the voltage generated at the second node N2 110. The output pin OP 112 is considered shorted when the output pin OP 112 is coupled to the ground terminal 124 or to a very low resistive load. The control signal CS 132 generated by the comparator 130 would be at logic high. The controller 140 on receiving the logic high control signal CS 132 would disable the first driver 102 and the second driver 106 by not providing them the driving voltage DV 144.

The disabling of the first driver 102 and the second driver 106 would result in the voltage at the first node N1 108 to be greater than the voltage generated at the second node N2 110. This result in the control signal CS 132 to transition to logic low which would falsely indicate the controller 140 that the short at the output pin OP 112 has been rectified. The controller 140 on receiving the logic low control signal CS 132 would again enable the first driver 102 and the second driver 106 by providing them a driving voltage DV 144.

Even on providing the driving voltage DV 144, the voltage at the first node N1 108 remains less than the voltage generated at the second node N2 110 since the output pin OP 112 is still shorted. This will result in the control signal CS 132 to transition to logic high and the controller 140 to disable the first driver 102 and the second driver 106.

The above cycle continue to repeat until the short at the output pin OP 112 is rectified. Thus, the circuit 100 has an inherent problem that when the short is detected at the output pin OP 112, it would cause a repetitive cycle of enabling and disabling of the first driver 102 and the second driver 106. This can damage the circuit 100 and especially the parts on the integrated circuit 120. The damage can be physical damage or the excess current/voltage at the output pin OP 112 can interfere with functioning of the integrated circuit 120. Also, certification standard like UL60950 require that output pins such as the output pin OP 112 on an integrated circuit meet certain current and voltage parameters. Thus, the circuit 100 is not able to address these concerns associated with the output pin OP 112 when the short is detected.

Figure 2:
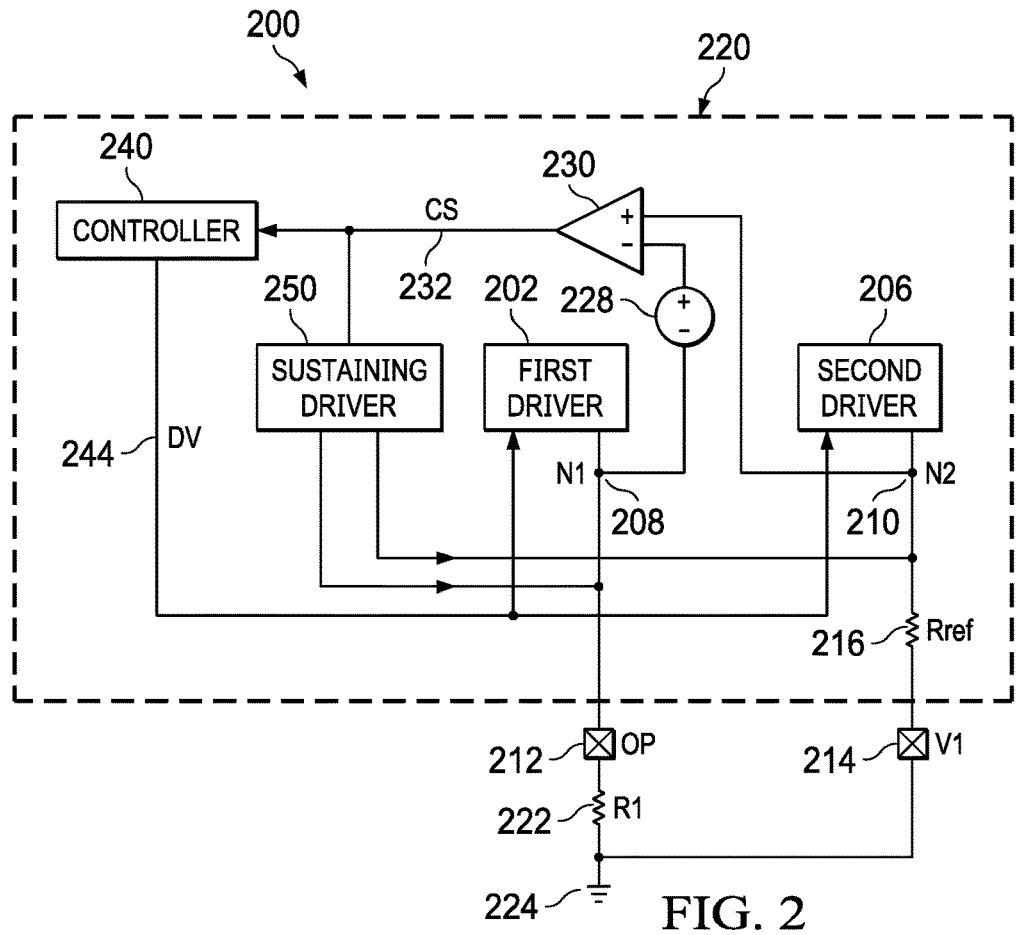
FIG. 2 is a block diagram of a circuit, according to an embodiment.

FIG. 2 is a block diagram of a circuit 200, according to an embodiment. The circuit 200 includes a first driver 202, a second driver 206, a comparator 230, a sustaining driver 250 and a controller 240. The first driver 202 is coupled to a first node N1 208, and the second driver 206 is coupled to a second node N2 210. The first node N1 208 is coupled to an output pin OP 212. The second node N2 210 is also coupled to a reference impedance Rref 216, and the reference impedance Rref 216 is coupled to a first voltage terminal V1 214.

In one example, the first driver 202, the second driver 206, the comparator 230, the controller 240, the sustaining driver 250 and the reference impedance Rref 216 are part of an integrated circuit (or device) 220. The output pin OP 212 is coupled to an external impedance R1 222. The external impedance R1 222 is not part of the integrated circuit 220, in one version. The external impedance R1 222 is coupled to a ground terminal 224. The first voltage terminal V1 214 is also coupled to the ground terminal 224. The comparator 230 is coupled to the first node N1 208 and the second node N2 210.

The controller 240 is coupled to the comparator 230. The first driver 202 and the second driver 206 are also coupled to the controller 240. In one example, the circuit 200 includes an offset power source 228 placed between the first node N1 208 and the comparator 230. The sustaining driver 250 is coupled to the comparator 230. The sustaining driver 250 is also coupled to the first node N1 208 and the second node N2 210. The circuit 200 may include one or more additional components that are not described herein for simplicity of the description.

In operation, the first driver 202 drives the external impedance R1 222. This generates a voltage at the first node N1 208. The second driver 206 drives the reference impedance Rref 216. This generates a voltage at the second node N2 210. The comparator 230 compares the voltage at the first node N1 208 and the voltage at the second node N2 210 to generate a control signal CS 232. The offset power source 228 is useful to mitigate errors introduced by various circuit components such as the first driver 202, the second driver 206 and the comparator 230. An error introduced by these circuit components can impact the comparison performed by the comparator 230. Therefore, the offset power source 228 compensates for the error introduced by these circuit components by providing an equal voltage or current in opposite polarity to the comparator 230.

In one example, the second driver 206 and the reference impedance Rref 216 are configured proportionately to the first driver 202 and the external impedance R1 222, such that the voltage generated at the second node N2 210 is within a predetermined range of the voltage generated at the first node N1 208 during non-short condition of the output pin OP 212. For example, the second driver 206 and the reference impedance Rref 216 produce a voltage at the second node N2 210 that is expected under normal or non-short condition. In another example, the second driver 206 and the reference impedance Rref 216 are configured proportionately to the first driver 202 and a lowest possible external impedance R1 222 in non-short condition, such that the voltage generated at the second node N2 210 is less than the voltage generated at the first node N1 208 during non-short condition of the output pin OP 212. A drive strength of the second driver 206 can be equal, proportional or scaled-down version of a drive strength of the first driver 202 based on the design requirements of the circuit 200.

The control signal CS 232 is provided to the controller 240. The controller 240 keeps the first driver 202 and the second driver 206 enabled by providing them a driving voltage DV 244. The circuit 200 operates in a regular mode and a calibration mode. In the regular mode, when the output pin OP 212 is not shorted i.e. it is not coupled to the ground terminal 224, the voltage generated at the first node N1 208 is greater than the voltage generated at the second node N2 210. The control signal CS 232 generated by the comparator 230 would be at logic low. The controller 240 on receiving the logic low control signal CS 232 would keep the first driver 202 and the second driver 206 enabled by providing them the driving voltage DV 244. In addition, the sustaining driver 250 remains in inactive state when the control signal CS 232 is at logic low state.

In the calibration mode, when the output pin OP 212 is shorted, the voltage generated at the first node N1 208 is less than the voltage generated at the second node N2 210. The output pin OP 212 is considered shorted when the output pin OP 212 is coupled to the ground terminal 224 or to a very low resistive load. The control signal CS 232 generated by the comparator 230 would be at logic high. The controller 240 on receiving the logic high control signal CS 232 would disable the first driver 202 and the second driver 206 by not providing them the driving voltage DV 244.

On receiving the logic high control signal CS 232, the sustaining driver 250 is enabled. The sustaining driver 250 provides a threshold current to each of the first node N1 208 and the second node N2 210. The threshold current maintains the first node N1 208 and the second node N2 210 at a defined operating level as a result of which the comparator 230 continue to generate the control signal CS 232 at logic high state.

Thus, even though the first driver 202 and the second driver 206 have been disabled by the controller 240, the voltages generated at the first node N1 208 and at the second node N2 210 are at the defined operating level. This maintains the control signal CS 232 at logic high state.

Thus, the sustaining driver 250 address the shortcomings of the circuit 100 by ensuring that the control signal CS 232 remains at logic high state until the short at the output pin OP 212 has been rectified. Hence, the circuit 200 does not suffer from the problem of multiple cycles of enabling and disabling of the first driver 202 and the second driver 206 during a period when the output pin OP 212 is shorted.

Once the short is not detected at the output pin OP 212, the circuit 200 switches from the calibration mode to the regular mode. Thus, when the short at the output pin OP 212 is rectified, the control signal CS 232 transitions from logic high state to logic low state. This disables the sustaining driver 250. The controller 240 on receiving the logic low control signal CS 232 would enable the first driver 202 and the second driver 206 by providing them the driving voltage DV 244.

Thus, the circuit 200 addresses the concerns associated with the output pin OP 212 when the short is detected. The circuit 200 does not have a problem of repetitive cycles of enabling and disabling of the first driver 202 and the second driver 206, and hence the circuit 200 is well protected from any damage caused by an excess current/voltage at the output pin OP 212. Also, the controller 240 does not affect any other output pin or any components connected to such output pin when the short is detected at the output pin OP 212. The circuit 200 also complies with certification standard like UL60950 that require output pins such as output pin OP 212 on an integrated circuit to meet certain current and voltage parameters.

Figure 3:
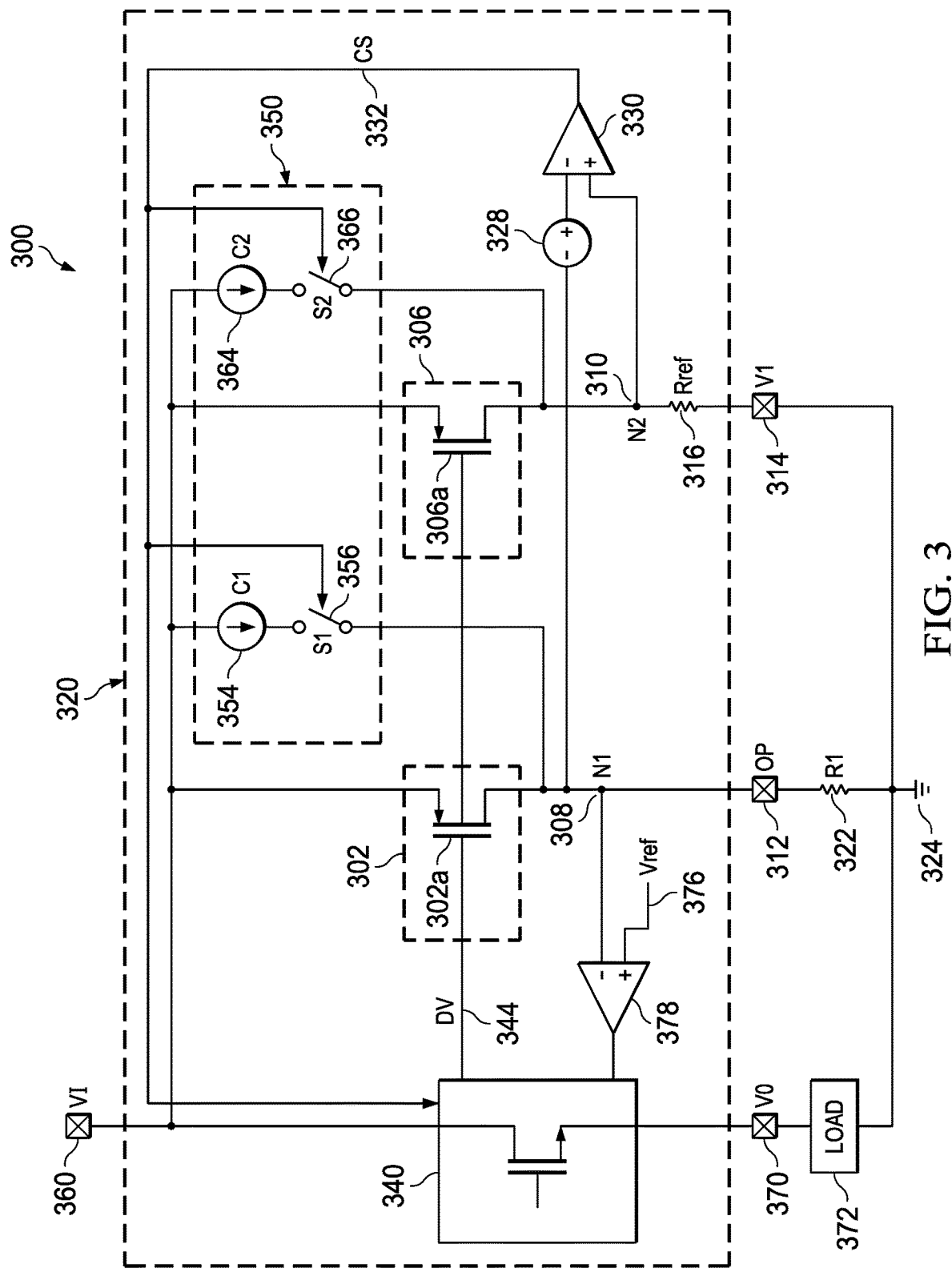
FIG. 3 is a schematic diagram of a circuit, according to an embodiment.

FIG. 3 is a schematic diagram of a circuit 300, according to an embodiment. The circuit 300 includes a first driver 302, a second driver 306, a comparator 330, a sustaining driver 350, a current limiter circuit 378 and a controller 340. The first driver 302 and the second driver 306 include one or more transistors. For example, the first driver 302 is illustrated to include a first transistor 302a, and the second driver 306 is illustrated to include a second transistor 306a.

The first driver 302 is coupled to a first node N1 308, and the second driver 306 is coupled to a second node N2 310. The first node N1 308 is coupled to an output pin OP 312. The second node N2 310 is also coupled to a reference impedance Rref 316, and the reference impedance Rref 316 is coupled to a first voltage terminal V1 314.

In one example, the first driver 302, the second driver 306, the comparator 330, the controller 340, the sustaining driver 350, the current limiter circuit 378 and the reference impedance Rref 316 are part of an integrated circuit (or device) 320. The output pin OP 312 is coupled to an external impedance R1 322. The external impedance R1 322 and a load 372 are not part of the integrated circuit 320, in one version. The external impedance R1 322 is coupled to a ground terminal 324. The first voltage terminal V1 314 is also coupled to a ground terminal 324. The comparator 330 is coupled to the first node N1 308 and the second node N2 310.

The controller 340 is coupled to the comparator 330. In one example, the controller 340 is a high power FET device. In another example, the controller 340 is a processing unit such as a CPU or a digital signal processor (DSP). In yet another example, the controller 340 is a controlling logic unit. The first driver 302 and the second driver 306 are also coupled to the controller 340. In one example, the circuit 300 includes an offset power source 328 placed between the first node N1 308 and the comparator 330. The sustaining driver 350 is coupled to the comparator 330. The sustaining driver 350 is also coupled to the first node N1 308 and the second node N2 310.

The sustaining driver 350 includes a first current source C1 354 coupled in parallel to the first driver 302 and a second current source C2 364 coupled in parallel to the second driver 306. A first switch S1 356 is coupled to the first current source C1 354 and the first node N1 308. A second switch S2 366 is coupled to the second current source C2 364 and the second node N2 310. The first current source C1 354 and the second current source C2 364 receive a source voltage V1 360.

The controller 340 receives the source voltage V1 360. The load 372 is coupled to the controller 340. The current limiter circuit 378 is coupled to the first node N1 308. The current limiter circuit 378 also receives a reference voltage Vref 376. The circuit 300 may include one or more additional components that are not described herein for simplicity of the description.

In operation, the first driver 302 drives the external impedance R1 322. This generates a voltage at the first node N1 308. The second driver 306 drives the reference impedance Rref 316. This generates a voltage at the second node N2 310. The comparator 330 compares the voltage at the first node N1 308 and the voltage at the second node N2 310 to generate a control signal CS 332. The offset power source 328 is useful to mitigate errors introduced by various circuit components such as the first driver 302, the second driver 306 and the comparator 330. An error introduced by these circuit components can impact the comparison performed by the comparator 330. Therefore, the offset power source 328 compensates for the error introduced by these circuit components by providing an equal voltage or current in opposite polarity to the comparator 330.

In one example, the second driver 306 and the reference impedance Rref 316 are configured proportionately to the first driver 302 and the external impedance R1 322, such that the voltage generated at the second node N2 310 is within a predetermined range of the voltage generated at the first node N1 308 during non-short condition of the output pin OP 312. For example, the second driver 306 and the reference impedance Rref 316 produce a voltage at the second node N2 310 that is expected under normal or non-short condition. In another example, the second driver 306 and the reference impedance Rref 316 are configured proportionately to the first driver 302 and a lowest possible external impedance R1 322 in non-short condition, such that the voltage generated at the second node N2 310 is less than the voltage generated at the first node N1 308 during non-short condition of the output pin OP 312. A drive strength of the second driver 306 can be equal, proportional or scaled-down version of a drive strength of the first driver 302 based on the design requirements of the circuit 300.

The control signal CS 332 is provided to the controller 340. The controller 340 keeps the first driver 302 and the second driver 306 enabled by providing them a driving voltage DV 344. The controller 340 also generates an output voltage VO 370 which is used to drive the load 372. The circuit 300 operates in a regular mode and a calibration mode. In the regular mode, when the output pin OP 312 is not shorted i.e. it is not coupled to the ground terminal 324, the voltage generated at the first node N1 308 is greater than the voltage generated at the second node N2 310. The control signal CS 332 generated by the comparator 330 would be at logic low. The controller 340 on receiving the logic low control signal CS 332 would keep the first driver 302 and the second driver 306 enabled by providing them the driving voltage DV 344. The control signal CS 332 is also provided to the first switch S1 356 and the second switch S2 366 in the sustaining driver 350. Both the first switch S1 356 and the second switch S2 366 in the sustaining driver 350 remains in open state when the control signal CS 332 is at logic low state. Thus, the sustaining driver 350 remains in inactive state when the control signal CS 332 is at logic low state. The current limiter circuit 378 compares the voltage generated at the first node N1 308 and the reference voltage Vref 376 and generates a current flag signal. The current flag signal indicates to the controller 340 if the output pin OP 312 is shorted or not shorted.

In the calibration mode, when the output pin OP 312 is shorted, the voltage generated at the first node N1 308 is less than the voltage generated at the second node N2 310. The output pin OP 312 is considered shorted when the output pin OP 312 is coupled to the ground terminal 324 or to a very low resistive load. The control signal CS 332 generated by the comparator 330 would be at logic high. The controller 340 on receiving the logic high control signal CS 332 would disable the first driver 302 and the second driver 306 by not providing them the driving voltage DV 344.

On receiving the logic high control signal CS 332, the sustaining driver 350 is enabled by closing of the first switch S1 356 and the second switch S2 366. The first current source C1 354 and the second current source C2 364 provide a threshold current to the first node N1 308 and the second node N2 310 respectively. The threshold current maintains the first node N1 308 and the second node N2 310 at a defined operating level as a result of which the comparator 330 continues to generate the control signal CS 332 at logic high state. In one example, the threshold current maintains the second node N2 310 at the defined operating level as a result of which the comparator 330 continues to generate the control signal CS 332 at logic high state for a time when the output pin OP 312 is shorted. In one example, a value of the threshold current depends on a specification of various components used in the circuit 300. In another example, a value of the threshold current keeps changing to accommodate process, voltage and temperature variations.

Thus, even though the first driver 302 and the second driver 306 have been disabled by the controller 340, the voltages generated at the first node N1 308 and at the second node N2 310 are at the defined operating level. In one example, the voltage generated at the second node N2 310 is maintained at the defined operating level. This maintains the control signal CS 332 at logic high state for a time when the output pin OP 312 is shorted.

Thus, the sustaining driver 350 address the shortcomings of the circuit 100 by ensuring that the control signal CS 332 remains at logic high state until the short at the output pin OP 312 has been rectified. Hence, the circuit 300 does not suffer from the problem of multiple cycles of enabling and disabling of the first driver 302 and the second driver 306 during a period when the output pin OP 312 is shorted.

Once the short is not detected at the output pin OP 312, the circuit 300 switches from the calibration mode to the regular mode. Thus, when the short at the output pin OP 312 is rectified, the control signal CS 332 transitions from logic high state to logic low state. This disables the sustaining driver 350 by keeping the first switch S1 356 and the second switch S2 366 in open state. The controller 340 on receiving the logic low control signal CS 332 would enable the first driver 302 and the second driver 306 by providing them the driving voltage DV 344.

Thus, the circuit 300 addresses the concerns associated with the output pin OP 312 when the short is detected. The circuit 300 does not have a problem of repetitive cycles of enabling and disabling of the first driver 302 and the second driver 306, and hence the circuit 300 and the load 372 are well protected from any damage caused by an excess current/voltage at the output pin OP 312. Also, the controller 340 does not affect any other output pin such as the output pin on which output voltage VO 370 is generated. Hence, the controller 340 does not affect any components such as load 372 when the short is detected at the output pin OP 312. The circuit 300 also complies with certification standard like UL60950 that require output pins such as output pin OP 312 on an integrated circuit to meet certain current and voltage parameters.

Figure 4:
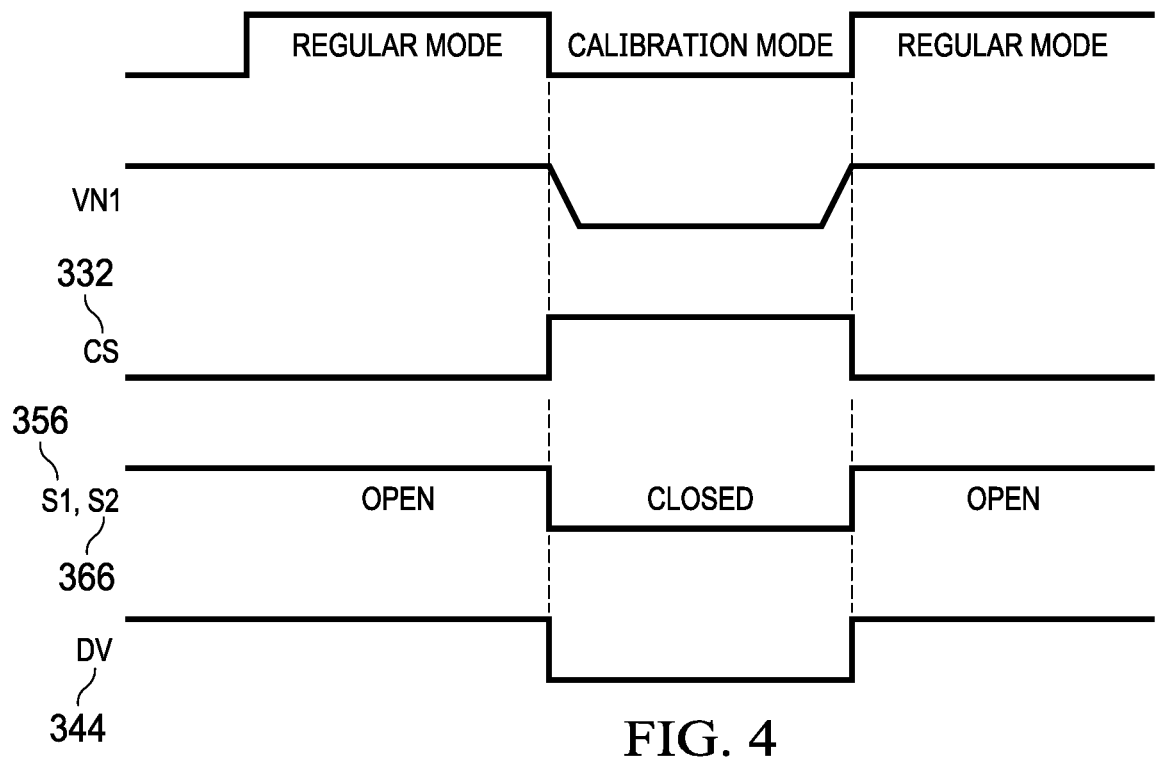
FIG. 4 is a timing diagram of operation of the circuit of FIG. 3, according to an embodiment.

FIG. 4 is a timing diagram of operation of the circuit of FIG. 3, according to an embodiment. The timing diagram illustrates voltage at node N1 308, the control signal CS 332, the first switch 356 and the second switch 366 and the driving voltage DV 344. The first driver 302 drives the external impedance R1 322. This generates a voltage VN1 at the first node N1 308.

The circuit 300 operates in a regular mode and a calibration mode. In the regular mode, when the output pin OP 312 is not shorted i.e. it is not coupled to the ground terminal 324, the voltage generated at the first node N1 308 is greater than the voltage generated at the second node N2 310. As illustrated in the timing diagram, the control signal CS 332 generated by the comparator 330 would be at logic low. The controller 340 on receiving the logic low control signal CS 332 would keep the first driver 302 and the second driver 306 enabled by providing them a driving voltage DV 344. Thus, the driving voltage DV 344 is illustrated in timing diagram at logic high during regular mode. Both the first switch S1 356 and the second switch S2 366 in the sustaining driver 350 remains in open state when the control signal CS 332 is at logic low state. Thus, the sustaining driver 350 remains in inactive state when the control signal CS 332 is at logic low state.

In the calibration mode, when the output pin OP 312 is shorted, the voltage generated at the first node N1 308 is less than the voltage generated at the second node N2 310. The output pin OP 312 is considered shorted when the output pin OP 312 is coupled to the ground terminal 324 or to a very low resistive load. The control signal CS 332 generated by the comparator 330 would be at logic high as illustrated in the timing diagram. The controller 340 on receiving the logic high control signal CS 332 would disable the first driver 302 and the second driver 306 by not providing them the driving voltage DV 344. Thus, the driving voltage DV 344 is illustrated in timing diagram at logic low during the calibration mode.

On receiving the logic high control signal CS 332, the first switch S1 356 and the second switch S2 366 are closed. The first current source C1 354 and the second current source C2 364 provide a threshold current to the first node N1 308 and the second node N2 310 respectively. The threshold current maintains the first node N1 308 and the second node N2 310 at a defined operating level as a result of which the comparator 330 continue to generate the control signal CS 332 at logic high state. Thus, even though the first driver 302 and the second driver 306 have been disabled by the controller 340, the voltages generated at the first node N1 308 and at the second node N2 310 are at the defined operating level. In one example, the threshold current maintains the second node N2 310 at the defined operating level. This maintains the control signal CS 332 at logic high state during the calibration mode.

As illustrated in the timing diagram, once the short is not detected at the output pin OP 312, the circuit 300 switches from the calibration mode to the regular mode. Thus, when the short at the output pin OP 312 is rectified, the control signal CS 332 transitions from logic high state to logic low state. This disables the sustaining driver 350 by keeping the first switch S1 356 and the second switch S2 366 in open state. The controller 340 on receiving the logic low control signal CS 332 would enable the first driver 302 and the second driver 306 by providing them the driving voltage DV 344. Thus, the driving voltage DV 344 as illustrated in timing diagram transitions to logic high during regular mode.

Thus, the circuit 300 addresses the concerns associated with the output pin OP 312 when the short is detected. The circuit 300 does not have a problem of repetitive cycles of enabling and disabling of the first driver 302 and the second driver 306, and hence the circuit 300 is well protected from any damage caused by an excess current/voltage at the output pin OP 312. Also, the controller 340 does not affect any other output pin such as the output pin on which output voltage VO 370 is generated. Hence, the controller 340 does not affect any components such as load 372 when the short is detected at the output pin OP 312. The circuit 300 also complies with certification standard like UL60950 that require output pins such as output pin OP 312 on an integrated circuit to meet certain current and voltage parameters.

Figure 5:
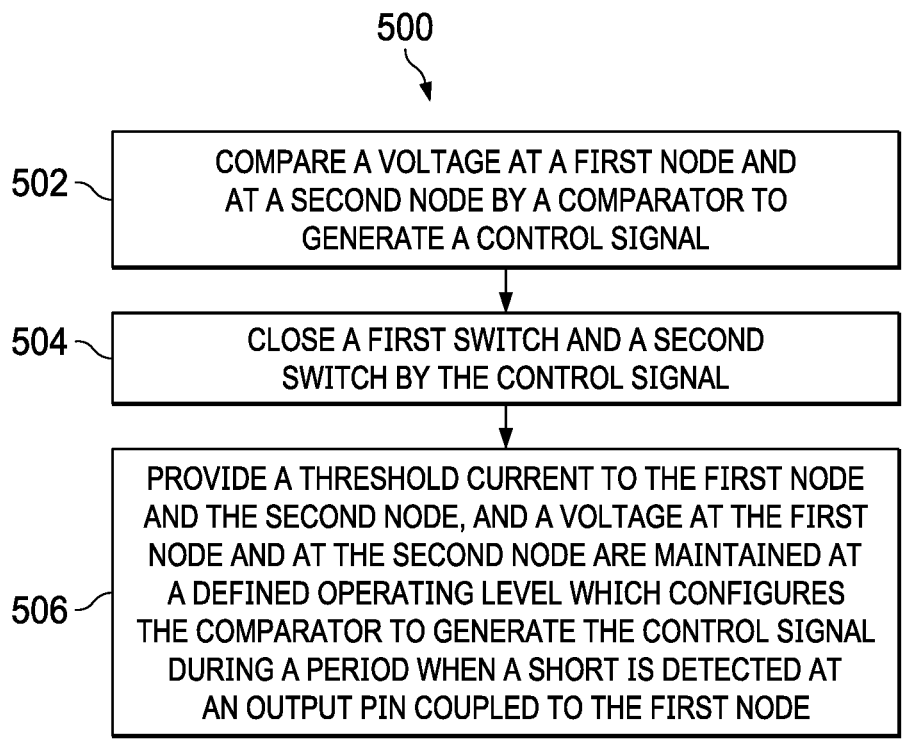
FIG. 5 is a flowchart of a method of operation of a circuit, according to an embodiment.

FIG. 5 is a flowchart 500 of a method of operation of a circuit, according to an embodiment. The flowchart 500 is explained in connection with the circuit 300. At step 502, a voltage at a first node and a voltage at a second node are compared by a comparator to generate a control signal. In circuit 300, for example, the comparator 330 compares the voltage at the first node N1 308 and the voltage at the second node N2 310 to generate a control signal CS 332. The first driver 302 drives the external impedance R1 322. This generates a voltage at the first node N1 308. The second driver 306 drives the reference impedance Rref 316. This generates a voltage at the second node N2 310.

At step 504, a first switch and a second switch are closed by the control signal. In circuit 300, on receiving the logic high control signal CS 332, the sustaining driver 350 is enabled by closing of the first switch S1 356 and the second switch S2 366. The control signal CS 332 generated by the comparator 330 would be at logic high when the output pin OP 312 is shorted. The short at the output pin OP 312 results in the voltage generated at the first node N1 308 to be less than the voltage generated at the second node N2 310. The output pin OP 312 is considered shorted when the output pin OP 312 is coupled to the ground terminal 324 or to a very low resistive load.

At step 506, a threshold current is provided to each of the first node and the second node. A voltage at the first node and at the second node are maintained at a defined operating level which configures the comparator to generate the control signal during a period when a short is detected at an output pin coupled to the first node. When the first switch S1 356 and the second switch S2 366 are closed, the first current source C1 354 and the second current source C2 364 provide a threshold current to the first node N1 308 and the second node N2 310 respectively. The threshold current maintains the first node N1 308 and the second node N2 310 at a defined operating level as a result of which the comparator 330 continue to generate the control signal CS 332 at logic high state for a time when the output pin OP 312 is shorted. In one example, the threshold current maintains the second node N2 310 at the defined operating level.

Thus, the method addresses the concerns associated with the output pin OP 312 when the short is detected. The method ensures that a circuit for example the circuit 300 is well protected from any damage caused by an excess current/voltage at the output pin OP 312. Also, the controller 340 does not affect any other output pin such as the output pin on which output voltage VO 370 is generated. Hence, the controller 340 does not affect any components such as load 372 when the short is detected at the output pin OP 312. The method also complies with certification standard like UL60950 that require output pins such as output pin OP 312 on an integrated circuit to meet certain current and voltage parameters.

Figure 6:
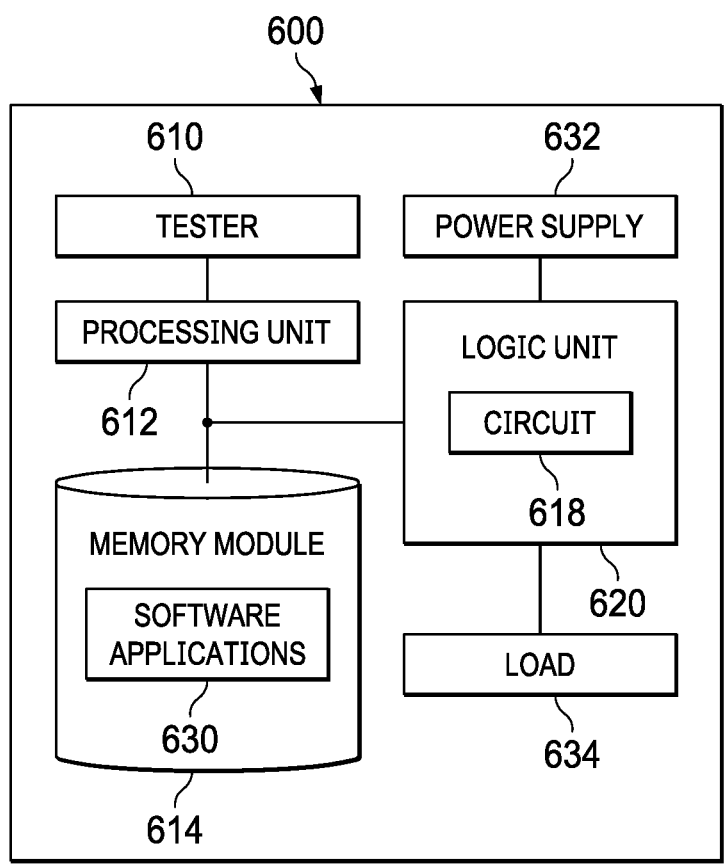
FIG. 6 illustrates a device, according to an embodiment.

FIG. 6 illustrates a device 600 according to an embodiment. The device 600 is, or is incorporated into, or finds application in, a microprocessor, a set-top box, a DVD recorder and player, an automotive navigation equipment, a digital camera, a gaming system, a printer, a networking equipment, a mobile communication device, such as a mobile phone, a personal digital assistant, a personal computer, a smartphone, or any other type of electronic system. The device 600 may include one or more additional components that are not described herein for simplicity of the description.

In some embodiments, the device 600 comprises a megacell or a system-on-chip (SoC) which includes a processing unit 612 such as a CPU (Central Processing Unit), a memory module 614 (e.g., random access memory (RAM)) and a tester 610. The processing unit 612 can be, for example, a CISC-type (Complex Instruction Set Computer) CPU, RISC-type CPU (Reduced Instruction Set Computer), or a digital signal processor (DSP).

The memory module 614 (which can be memory such as RAM, flash memory, or disk storage) stores one or more software applications 630 (e.g., embedded applications) that, when executed by the processing unit 612, perform any suitable function associated with the device 600. The tester 610 comprises logic that supports testing and debugging of the device 600 executing the software applications 630.

For example, the tester 610 can be used to emulate a defective or unavailable component(s) of the device 600 to allow verification of how the component(s), were it actually present on the device 600, would perform in various situations (e.g., how the component(s) would interact with the software applications 630). In this way, the software applications 630 can be debugged in an environment which resembles post-production operation.

The processing unit 612 typically comprises a memory and logic which store information frequently accessed from the memory module 614. The device 600 includes a logic unit 620, a power supply 632 and a load 634. The logic unit 620 is coupled to the processing unit 612 and the memory module 614. The logic unit 620 is also coupled to the power supply 632 and the load 634. The logic unit 620 includes a circuit 618. The circuit 618 is analogous to the circuit 200 in connection and operation.

The circuit 618 includes a first driver, a second driver, a comparator, a sustaining driver and a controller. The first driver is coupled to a first node N1, and the second driver is coupled to a second node N2. The first node N1 is coupled to an output pin OP. The second node N2 is also coupled to a reference impedance Rref, and the reference impedance Rref is coupled to a first voltage terminal V1. The output pin OP is coupled to an external impedance R1. The external impedance R1 is coupled to a ground terminal. The comparator is coupled to the first node N1 208 and the second node N2 210. The controller 240 is coupled to the comparator 230. The first driver 202 and the second driver 206 are also coupled to the controller 240.

As described in reference to FIG. 3, the sustaining driver includes a first current source C1 coupled in parallel to the first driver and a second current source C2 coupled in parallel to the second driver. A first switch S1 is coupled to the first current source C1 and the first node N1. A second switch S2 is coupled to the second current source C2 and the second node N2. The first current source C1 and the second current source C2 receive a source voltage V1. The controller receives the source voltage. A load is coupled to the controller. The load is similar to the load 634.

The circuit 618 operates in a regular mode and a calibration mode. In the regular mode, when the output pin OP is not shorted i.e. it is not coupled to the ground terminal, the voltage generated at the first node N1 is greater than the voltage generated at the second node N2. The comparator compares the voltage at the first node N1 and the voltage at the second node N2 to generate a control signal CS. The control signal CS generated by the comparator would be at logic low. The controller on receiving the logic low control signal CS would keep the first driver and the second driver enabled by providing them a driving voltage DV. The control signal CS is also provided to the first switch S1 and the second switch S2 in the sustaining driver. Both the first switch S1 and the second switch S2 remains in open state when the control signal CS is at logic low state. Thus, the sustaining driver remains in inactive state when the control signal CS is at logic low state.

In the calibration mode, when the output pin OP is shorted, the voltage generated at the first node N1 is less than the voltage generated at the second node N2. The output pin OP is considered shorted when the output pin OP is coupled to the ground terminal or to a very low resistive load. The control signal CS generated by the comparator would be at logic high. The controller on receiving the logic high control signal CS would disable the first driver and the second driver by not providing them the driving voltage DV.

On receiving the logic high control signal CS, the sustaining driver 250 is enabled by closing of the first switch S1 and the second switch S2. The first current source C1 and the second current source C2 provide a threshold current to the first node N1 and the second node N2 respectively. The threshold current maintains the first node N1 and the second node N2 at a defined operating level as a result of which the comparator continue to generate the control signal CS at logic high state.

Thus, the circuit 618 addresses the concerns associated with the output pin OP when the short is detected. The circuit 618 does not have a problem of repetitive cycles of enabling and disabling of the first driver and the second driver, and hence the circuit 618 is well protected from any damage caused by an excess current/voltage at the output pin OP.

Modifications are possible in the described embodiments, and other embodiments are possible, within the scope of the claims.

What is claimed is:

1. A circuit comprising:
   a first driver coupled to a first node, the first node coupled to an output pin;
   a second driver coupled to a second node, the second node coupled to a first voltage terminal;
   a comparator coupled to the first node and the second node; and
   a sustaining driver coupled to the comparator and configured to provide a threshold current to each of the first node and the second node when a short is detected at the output pin.

2. The circuit of claim 1, wherein the sustaining driver comprises:
   a first current source coupled in parallel to the first driver and configured to receive a source voltage;
   a second current source coupled in parallel to the second driver and configured to receive the source voltage;
   a first switch coupled to the first current source and the first node; and
   a second switch coupled to the second current source and the second node, wherein the first switch and the second switch are configured to be closed when the short is detected at the output pin.

3. The circuit of claim 1, wherein the short is detected when the output pin is coupled to a ground terminal.

4. The circuit of claim 2 is configured to operate in a regular mode and a calibration mode, wherein the circuit operates in the calibration mode when the short is detected at the output pin.

5. The circuit of claim 4, wherein in the regular mode:
   the comparator is configured to compare a voltage at the first node and a voltage at the second node and generate a control signal; and
   the first switch and the second switch remain in open state.

6. The circuit of claim 5, wherein in the calibration mode:
   the comparator is configured to compare the voltage at the first node and the voltage at the second node and generate the control signal;
   the first switch and the second switch are configured to be closed by the control signal; and
   the first node and the second node each are configured to receive the threshold current from the first current source and the second current source respectively, wherein the voltage at the first node and at the second node are maintained at a defined operating level which configures the comparator to generate the control signal during a period when the output pin is shorted.

7. The circuit of claim 4 switches from the calibration mode to the regular mode when the short is not detected at the output pin.

8. A method comprising operating a circuit in a regular mode and in a calibration mode, and in the calibration mode:
   comparing a voltage at a first node and a voltage at a second node by a comparator to generate a control signal;
   closing a first switch and a second switch in response to the control signal; and
   providing a threshold current to each of the first node and the second node, wherein the voltage at the first node and at the second node are maintained at a defined operating level for enabling the comparator to generate the control signal during a period when a short is detected at an output pin coupled to the first node.

9. The method of claim 8, wherein comparing the voltage at the first node and the voltage at the second node further comprises:
coupling a first driver to the first node;
coupling a second driver to the second node; and
coupling the first node and the second node to the comparator.

10. The method of claim 9, wherein providing the threshold current further comprises:
coupling a first current source in parallel to the first driver;
coupling a second current source in parallel to the second driver, the first current source and the second current source are coupled to a source voltage;
coupling the first switch to the first current source and the first node; and
coupling the second switch to the second current source and the second node.

11. The method of claim 10 further comprising closing the first switch and the second switch when the short is detected at the output pin.

12. The method of claim 11 further comprising detecting the output pin is shorted when the output pin is coupled to a ground terminal.

13. The method of claim 10, wherein operating the circuit in regular mode further comprises:
comparing the voltage at the first node and the voltage at the second node to generate the control signal; and
keeping the first switch and the second switch in open state.

14. An integrated circuit comprising:
a controller configured to receive a source voltage;
a load coupled to the controller;
a first driver coupled to a first node, the first node coupled to an output pin;
a second driver coupled to a second node, the second node coupled to a first voltage terminal, the controller configured to provide a driving voltage to the first driver and the second driver;
a comparator coupled to the first node and the second node; and
a sustaining driver coupled to the comparator and configured to provide a threshold current to each of the first node and the second node when a short is detected at the output pin.

15. The integrated circuit of claim 14 further comprising a current limiter circuit coupled to the first node and configured to provide a current flag signal to the controller.

16. The integrated circuit of claim 14, wherein the sustaining driver comprises:
a first current source coupled in parallel to the first driver and configured to receive the source voltage;
a second current source coupled in parallel to the second driver and configured to receive the source voltage;
a first switch coupled to the first current source and the first node; and
a second switch coupled to the second current source and the second node, wherein the first switch and the second switch are configured to be closed when the short is detected at the output pin.

17. The integrated circuit of claim 16 is configured to operate in a regular mode and a calibration mode, wherein the integrated circuit operates in the calibration mode when the short is detected at the output pin.

18. The integrated circuit of claim 17, wherein in the regular mode:
the comparator is configured to compare a voltage at the first node and a voltage at the second node and generate a control signal; and
the first switch and the second switch remain in open state.

19. The integrated circuit of claim 18, wherein in the calibration mode:
the comparator is configured to compare the voltage at the first node and the voltage at the second node and generate the control signal;
the first switch and the second switch are configured to closed by the control signal; and
the first node and the second node each are configured to receive the threshold current from the first current source and the second current source respectively, wherein the voltage at the first node and at the second node are maintained at a defined operating level which configures the comparator to generate the control signal during a period when the output pin is shorted.

20. The integrated circuit of claim 19, wherein the control signal is provided to the controller and wherein:
in the calibration mode, the controller is configured to disable the first driver and the second driver when the short is detected at the output pin; and
in the regular mode, the controller is configured to enable the first driver and the second driver by providing the driving voltage.

21. A device comprising:
a power supply;
a logic unit coupled to the power supply; and
a load coupled to the logic unit, wherein the logic unit comprising a circuit, the circuit comprising:
a first driver coupled to a first node, the first node coupled to an output pin;
a second driver coupled to a second node, the second node coupled to a first voltage terminal;
a comparator coupled to the first node and the second node; and
a sustaining driver coupled to the comparator and configured to provide a threshold current to each of the first node and the second node when a short is detected at the output pin.

22. The device of claim 21 further comprising:
a processing unit; and
a memory module coupled to the processing unit, wherein the logic unit is coupled to the processing unit and the memory module.

23. The device of claim 21, wherein the sustaining driver comprises:
a first current source coupled in parallel to the first driver and configured to receive a source voltage;
a second current source coupled in parallel to the second driver and configured to receive the source voltage;
a first switch coupled to the first current source and the first node; and
a second switch coupled to the second current source and the second node, wherein the first switch and the second switch are configured to be closed when the short is detected at the output pin.

24. The device of claim 23, wherein the circuit is configured to operate in a regular mode and a calibration mode, wherein the circuit operates in the calibration mode when the short is detected at the output pin.

25. The device of claim 24, wherein in the calibration mode:
- the comparator is configured to compare a voltage at the first node and a voltage at the second node and generate a control signal;
- the first switch and the second switch are configured to be closed by the control signal; and
- the first node and the second node each are configured to receive the threshold current from the first current source and the second current source respectively, wherein the voltage at the first node and at the second node are maintained at a defined operating level which configures the comparator to generate the control signal during a period when the output pin is shorted.

* * * * *